United States Patent
Ogami et al.

(10) Patent No.: US 8,813,021 B1
(45) Date of Patent: Aug. 19, 2014

(54) GLOBAL RESOURCE CONFLICT MANAGEMENT FOR AN EMBEDDED APPLICATION DESIGN

(75) Inventors: Kenneth Y. Ogami, Bothell, WA (US); Andrew Best, Stanford, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1332 days.

(21) Appl. No.: 11/707,201

(22) Filed: Feb. 14, 2007

Related U.S. Application Data

(60) Provisional application No. 60/774,295, filed on Feb. 16, 2006.

(51) Int. Cl.
*G06F 9/44* (2006.01)
*G06F 11/00* (2006.01)

(52) U.S. Cl.
USPC ........... 717/100; 717/125; 717/126; 714/38.1

(58) Field of Classification Search
USPC .................... 717/100, 104–105, 124–135; 714/37–57; 703/23–28
See application file for complete search history.

(56) References Cited

U.S. PATENT DOCUMENTS

| | | |
|---|---|---|
| 4,488,256 A | 12/1984 | Zolnowsky |
| 4,837,676 A | 6/1989 | Rosman |
| 4,837,682 A | 6/1989 | Culler |
| 4,975,865 A | 12/1990 | Carrette |
| 5,179,660 A | 1/1993 | Devany |
| 5,193,187 A | 3/1993 | Strout, II |
| 5,210,750 A | 5/1993 | Nassehi |
| 5,243,529 A | 9/1993 | Kashiwazaki |
| 5,260,611 A | 11/1993 | Cliff |
| 5,262,943 A | 11/1993 | Thibado |
| 5,289,535 A | 2/1994 | Bogart |
| 5,298,805 A | 3/1994 | Garverick |
| 5,313,620 A | 5/1994 | Cohen |
| 5,317,209 A | 5/1994 | Garverick |
| 5,323,069 A | 6/1994 | Smith, Jr. |
| 5,338,984 A | 8/1994 | Sutherland |
| 5,339,392 A | 8/1994 | Risberg |
| 5,345,380 A | 9/1994 | Babson, III |
| 5,369,742 A | 11/1994 | Kurosu |
| 5,371,684 A | 12/1994 | Iadonato |
| 5,436,575 A | 7/1995 | Pedersen |
| 5,442,763 A | 8/1995 | Bartfai |
| 5,504,899 A | 4/1996 | Raz |
| 5,506,963 A | 4/1996 | Ducateau |
| 5,546,595 A * | 8/1996 | Norman et al. ................. 710/10 |
| 5,574,655 A | 11/1996 | Knapp |
| 5,590,342 A | 12/1996 | Marisetty |
| 5,598,545 A | 1/1997 | Childers et al. |
| 5,615,389 A * | 3/1997 | Mayfield et al. ................ 710/8 |

(Continued)

OTHER PUBLICATIONS

Sokolsky, Oleg, "Resource Modeling for Embedded Systems Design", IEEE, 2004, 6pg.*

(Continued)

*Primary Examiner* — Ryan Coyer

(57) ABSTRACT

A design tool provides global resource conflict management. The design tool identifies a conflict in requested values of a global resource during development of an embedded application. The design tool further calculates new values of the global resource, and proposes the new values of the global resource as an alternative to the requested values to assist a user in resolution of the conflict.

20 Claims, 9 Drawing Sheets

(56) References Cited

U.S. PATENT DOCUMENTS

| | | | |
|---|---|---|---|
| 5,619,456 A | 4/1997 | McClure | |
| 5,628,025 A | 5/1997 | Chung | |
| 5,634,004 A | 5/1997 | Gopinath | |
| 5,648,795 A | 7/1997 | Vouri | |
| 5,745,750 A | 4/1998 | Porcaro | |
| 5,745,904 A | 4/1998 | King | |
| 5,761,138 A | 6/1998 | Lee | |
| 5,764,089 A | 6/1998 | Partovi | |
| 5,764,984 A | 6/1998 | Loucks | |
| 5,774,005 A | 6/1998 | Partovi | |
| 5,781,720 A | 7/1998 | Parker et al. | |
| 5,801,967 A | 9/1998 | Henderson | |
| 5,832,211 A | 11/1998 | Blakley, III | |
| 5,930,336 A | 7/1999 | Junqua | |
| 5,966,729 A | 10/1999 | Phelps | |
| 5,990,717 A | 11/1999 | Partovi et al. | |
| 6,014,036 A | 1/2000 | Bozso | |
| 6,034,541 A | 3/2000 | Kopec, Jr. | |
| 6,072,431 A | 6/2000 | Froeberg | |
| 6,085,317 A | 7/2000 | Smith | |
| 6,104,251 A | 8/2000 | Ramey et al. | |
| 6,137,466 A | 10/2000 | Moughanni | |
| H1920 H | 11/2000 | Xu | |
| 6,161,151 A * | 12/2000 | Sudhakaran et al. | 710/10 |
| 6,188,262 B1 | 2/2001 | Sutherland | |
| 6,219,785 B1 | 4/2001 | Smith | |
| 6,242,950 B1 | 6/2001 | Bozso | |
| 6,252,544 B1 | 6/2001 | Hoffberg | |
| 6,266,041 B1 | 7/2001 | Cairns | |
| 6,275,920 B1 | 8/2001 | Abercrombie et al. | |
| 6,285,966 B1 | 9/2001 | Brown | |
| 6,292,830 B1 | 9/2001 | Taylor | |
| 6,332,160 B1 | 12/2001 | Tabuchi | |
| 6,366,653 B1 | 4/2002 | Yeh | |
| 6,374,369 B1 * | 4/2002 | O'Donnell | 714/38.11 |
| 6,429,812 B1 | 8/2002 | Hoffberg | |
| 6,434,447 B1 | 8/2002 | Shteyn | |
| 6,540,674 B2 | 4/2003 | Zadrozny | |
| 6,559,861 B1 | 5/2003 | Kennelly | |
| 6,636,901 B2 | 10/2003 | Sudhakaran et al. | |
| 6,781,991 B1 | 8/2004 | Anderlind | |
| 6,809,736 B1 | 10/2004 | Stauffer | |
| 6,917,812 B2 | 7/2005 | Damnjanovic | |
| 6,941,477 B2 | 9/2005 | O'Keefe | |
| 7,028,019 B2 | 4/2006 | Mcmillan et al. | |
| 7,047,521 B2 | 5/2006 | Bunnell | |
| 7,053,863 B2 | 5/2006 | Glen et al. | |
| 7,058,626 B1 | 6/2006 | Pan | |
| 7,085,752 B2 | 8/2006 | Mortensen | |
| RE39,284 E | 9/2006 | Marisetty | |
| 7,145,362 B1 | 12/2006 | Bergendahl | |
| 7,171,686 B1 | 1/2007 | Jansen et al. | |
| 7,174,548 B2 | 2/2007 | Louzoun et al. | |
| 7,184,359 B1 | 2/2007 | Bridgewater et al. | |
| 7,212,999 B2 | 5/2007 | Friesen | |
| 7,246,193 B2 | 7/2007 | Rotvold | |
| RE39,837 E | 9/2007 | Marisetty | |
| 7,275,096 B2 | 9/2007 | Green | |
| 7,281,040 B1 | 10/2007 | Ly | |
| 7,284,157 B1 | 10/2007 | Mcmichael et al. | |
| 7,346,705 B2 | 3/2008 | Hullot | |
| 7,461,358 B2 | 12/2008 | Wu | |
| 7,464,370 B2 | 12/2008 | Barsness | |
| 7,487,471 B2 | 2/2009 | Wu | |
| 7,502,031 B1 | 3/2009 | Pike et al. | |
| 7,506,274 B2 | 3/2009 | Zhang | |
| 7,506,305 B2 * | 3/2009 | Cornelius et al. | 717/113 |
| 7,522,125 B2 | 4/2009 | Glen et al. | |
| 7,546,611 B2 | 6/2009 | Kim et al. | |
| 7,551,832 B2 | 6/2009 | Plourde, Jr. | |
| 7,643,417 B2 | 1/2010 | Van Nieuwenhuizen | |
| 7,683,872 B2 | 3/2010 | Jan et al. | |
| 7,685,105 B2 | 3/2010 | Rosenblum | |
| 7,715,339 B2 | 5/2010 | Sarja | |
| 7,730,167 B2 | 6/2010 | Starbuck | |
| 7,779,046 B2 | 8/2010 | Hwang | |
| 7,834,882 B2 | 11/2010 | Stauffer | |
| 7,856,422 B2 | 12/2010 | Linkert | |
| 7,861,273 B2 * | 12/2010 | Fries et al. | 725/80 |
| 8,028,258 B1 | 9/2011 | Ogami et al. | |
| 8,051,381 B2 | 11/2011 | Ebrom et al. | |
| 8,074,231 B2 | 12/2011 | Hunt et al. | |
| 2002/0157043 A1 * | 10/2002 | Hite et al. | 714/51 |
| 2002/0169804 A1 | 11/2002 | Faist | |
| 2003/0014381 A1 | 1/2003 | Mcmillan et al. | |
| 2003/0023772 A1 * | 1/2003 | Slivka et al. | 709/327 |
| 2003/0167454 A1 * | 9/2003 | Iordanov et al. | 717/104 |
| 2004/0103434 A1 | 5/2004 | Ellis | |
| 2004/0153830 A1 | 8/2004 | Cebula et al. | |
| 2005/0015639 A1 | 1/2005 | Cornelius et al. | |
| 2005/0060723 A1 | 3/2005 | Eldar | |
| 2005/0097168 A1 | 5/2005 | Mukherjee | |
| 2005/0177632 A1 | 8/2005 | Yach | |
| 2005/0256907 A1 | 11/2005 | Novik | |
| 2006/0103867 A1 | 5/2006 | Kato | |
| 2006/0168586 A1 | 7/2006 | Stone | |
| 2006/0212330 A1 | 9/2006 | Savilampi | |
| 2006/0259885 A1 | 11/2006 | Mortensen et al. | |
| 2006/0271537 A1 | 11/2006 | Chandrasekharan | |
| 2007/0050710 A1 | 3/2007 | Redekop | |
| 2007/0094673 A1 * | 4/2007 | Hunt et al. | 719/321 |
| 2007/0130548 A1 | 6/2007 | Zhaksilikov et al. | |
| 2007/0156512 A1 | 7/2007 | Yerkie | |
| 2008/0133598 A1 | 6/2008 | Williams et al. | |
| 2008/0140677 A1 | 6/2008 | Shin | |
| 2009/0013270 A1 | 1/2009 | Helfman | |
| 2009/0089039 A1 | 4/2009 | Shufer | |
| 2010/0251233 A1 | 9/2010 | Majewski et al. | |
| 2011/0202918 A1 | 8/2011 | Park et al. | |

OTHER PUBLICATIONS

Stepner et al., "Embedded Application Design Using a Real-Time OS", ACM, 1999, 6pg.*

Tech Support, "When Devices Clash", Apr. 2003, vol. 4, Issue 4, 6pg.*

U.S. Appl. No. 11/707,202 "Global Parameter Management Graphical User Interface (GUI) for Embedded Application Design", filed Feb. 14, 2007; 35 pages.

Cypress Micorsystems, Application Note. "Global Resources in PSoC TM Designer." AN2221, Revision A, Oct. 15, 2004, 7 pages.

Cypress Perform, PSoC Designer TM, IDE User Guide, Document #38-12002 Rev. B. 2002-2005, 193 pages.

Cypress, Application Note, "PSoC Express TM Primer: First Introduction," AN2261, Revision A, Mar. 15, 2005, pp. 1-19.

Person et al., Special Edition Using Windows 95, Second Edition, 1997, pp. 194-196.

Tech Support, Apr. 2003, vol. 4. Issue 4, 1 page image.

USPTO Advisory Action for U.S. Appl. No. 11/707,202 dated Apr. 15, 2010; 3 pages.

USPTO Advisory Action for U.S. Appl. No. 11/707,202 dated Jun. 18, 2012; 3 pages.

USPTO Final Rejection for U.S. Appl. No. 11/707,201 dated Mar. 2, 2011; 20 pages.

USPTO Final Rejection for U.S. Appl. No. 11/707,202 dated Feb. 2, 2010; 10 pages.

USPTO Final Rejection for U.S. Appl. No. 11/707,202 dated Mar. 26, 2012; 14 pages.

USPTO Non-Final Rejection for U.S. Appl. No. 11/512,545 May 13, 2008; 7 pages.

USPTO Non-Final Rejection for U.S. Appl. No. 11/707,202 dated Jun. 23, 2010; 14 pages.

USPTO Non-Final Rejection for U.S. Appl. No. 11/707,202 dated Sep. 17, 2009; 11 pages.

(56) References Cited

OTHER PUBLICATIONS

USPTO Non-Final Rejection for U.S. Appl. No. 11/707,202 dated Sep. 30, 2011; 12 pages.
USPTO Non-Final Rejection for U.S. Appl. No. 11/707,202 dated Nov. 5, 2012; 13 pages.
USPTO Notice of Allowance for U.S. Appl. No. 11/512,545 Oct. 7, 2008; 7 pages.
USPTO Notice of Allowance for U.S. Appl. No. 11/707,202 dated Dec. 8, 2010; 9 pages.
USPTO Final Rejection for U.S. Appl. No. 11/707,202 dated Apr. 11, 2013; 14 pages.
USPTO Non-Final Rejection for U.S. Appl. No. 11/707,202 dated Aug. 22, 2013; 14 pages.

* cited by examiner

GLOBAL RESOURCE CONFLICT MANAGEMENT FOR AN EMBEDDED APPLICATION DESIGN

CROSS-REFERENCE TO RELATED APPLICATIONS

This application claims the benefit of U.S. Provisional Application No. 60/774,295, filed Feb. 16, 2006, and incorporated herein by reference in its entirety.

TECHNICAL FIELD

Embodiments of the invention relate generally to embedded application development and more specifically, but not exclusively, to resolving conflicting parameter settings of a global resource during development of an embedded application.

BACKGROUND

Shortened time to design and user error reduction are essential to the success of application development environments. Current application development environments are geared towards system engineers. Conventional design tools generally fail to produce deterministic outcomes when conflicting driver properties are set in a design. This is because conventional drivers are allowed to modify global resources without regard to conflicting values requested by other drivers. Thus, in a conventional embedded application design, conflicts are generally managed manually. As a result, a system engineer would often need to manually modify the conflicting driver properties when adding, deleting, or modifying drivers that request different parameter settings of a global resource.

Moreover, system engineers are typically accustomed to describing a design at a higher level than the hardware level. For example, a clock driver may be described at the system level in terms of clock frequency. However, at the hardware level, clock distribution is often described by clock divider ratios. Thus, with conventional design tools, a user may need to hand code in assembly or C code to manually modify conflicting driver properties at a hardware level. Such an approach may be too low level for system designers. Thus, the conventional approach is inefficient and error prone.

BRIEF DESCRIPTION OF THE DRAWINGS

The present invention is illustrated by way of example and not limitation in the figures of the accompanying drawings, in which.

DETAILED DESCRIPTION

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Global resource conflict management resolves conflicting requests by drivers on a common global resource. In the following descriptions, drivers are associated with a hardware component of a processing device for an embedded application. Details about the drivers are described later with reference to FIG. 6. Different drivers may request different values of a driver property supported by a global resource. These different property values may sometimes cause a conflict in the global resource. For example, a clock may be a global resource and the frequency of the clock may be the requested driver property. Clock divider hardware may be used to divide a global clock into different clock frequencies. However, it is sometimes not possible to divide a global clock to match the exact clock frequencies requested by the drivers. When a global resource cannot satisfy the requests of the drivers, a conflict occurs. Conflicts may also arise when drivers requesting other global resources, e.g., voltage distributor and other types of global resources.

Embodiments of present invention detect conflict in the requested settings of a global resource and assist a user to modify the requested settings in resolution of conflicts. The assistance to the user may be provided by proposing alternative driver property values that closely match requested values. It is understood that the driver property value referred to herein correspond to a parameter setting of the global resource. Thus, in the following descriptions, the terms "driver property value" and "parameter setting" are used synonymously.

Figure 1:
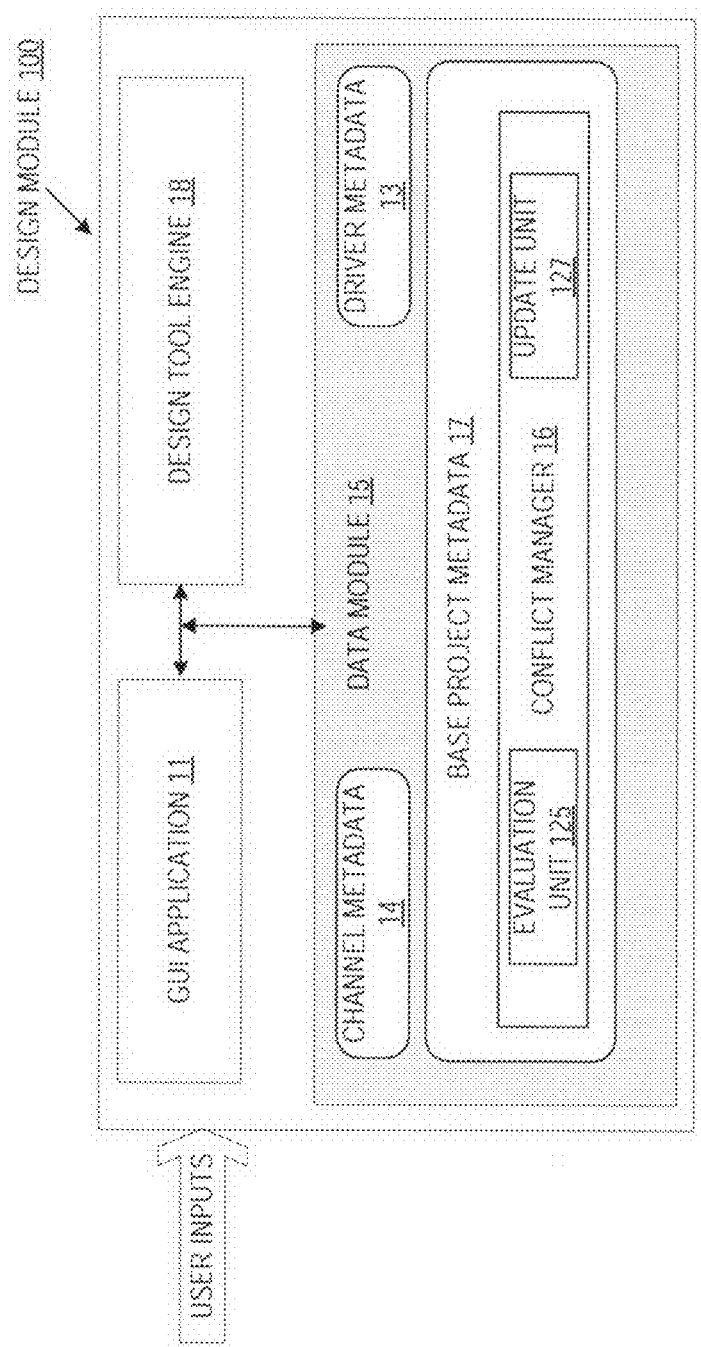
FIG. 1 is a block diagram of one embodiment of a design module that facilitates global resource conflict management.

FIG. 1 illustrates one embodiment of a design module 100 that performs global resource conflict management. Design module 100 forms at least a portion of a design tool that facilitates a user to design an embedded system on a chip. In this embodiment, design module 100 includes a graphical user interface (GUI) application 11 that renders a conflict management GUI to assist a user in resolving conflicts on a global resource. Design module 100 also includes a design tool engine 18 that configures a processing device into an embedded system according to a user's system-level specification.

Design module further includes one or more conflict managers 16 (only one is shown). Conflict managers 16 operate in conjunction with the conflict management GUI to resolve conflicting requests on global resource settings. Each conflict manager 16 manages conflicts for an associated global resource. For example, a clock source may be managed by a clock manager and a voltage source may be managed by a voltage manager. Other types of conflict managers may exist for different global resources. Conflict manager 16 includes an evaluation unit 125, which evaluates driver requests to determine whether a conflict exists. Conflict manager 16 may also include an update unit 127, which calculates alternative values to resolve the conflict.

Conflict manager 16 may be part of a data module 15 that includes driver metadata 13, channel metadata 14, and base project metadata 17. Driver metadata 13, channel metadata 14, and base project metadata 17 may be managed and coordinated by design tool engine 18. In the embodiment as shown, conflict manager 16 may be implemented by a manager script in base project metadata 17. The manager script defines management rules, and may include a conflict resolution algorithm. Each global resource may be associated with a conflict manger 16 that operates according to a set of management rules tailored to that global resource. The manager script may be added or modified without any change to the design tool engine code. Examples of the manager script may include JavaScript and other suitable scripting languages.

Driver metadata 13 may include an attribute indicating whether a driver property involves a global resource. Driver metadata 13 may also include, but is not limited to, the name of an associated channel property, the property values requested by the respective driver, a script that translates a driver property value to a corresponding channel property value, and a script that translates a channel property value to a corresponding driver property value.

Channel metadata 14 defines the properties that can be associated with conflict managers 16. Channel metadata 14 may include a script, e.g., JavaScript or other scripting languages, to apply the results of the manager script. Channel metadata 14 forms, at least in part, a channel that acts as a proxy for the associated driver with respect to global resource management, thus hiding hardware complexities from the drivers. A channel may be associated with one or more conflict managers 16. When a driver is added, the associated channel registers a request on behalf of the driver with the appropriate conflict manager 16. When a driver is deleted, the associated channel removes the request on behalf of the driver from the appropriate conflict manager. When a driver modifies a property value, the associated channel updates the value request. More details about the drivers, channels, and base projects are described later with reference to FIGS. 6-8.

Figure 2:
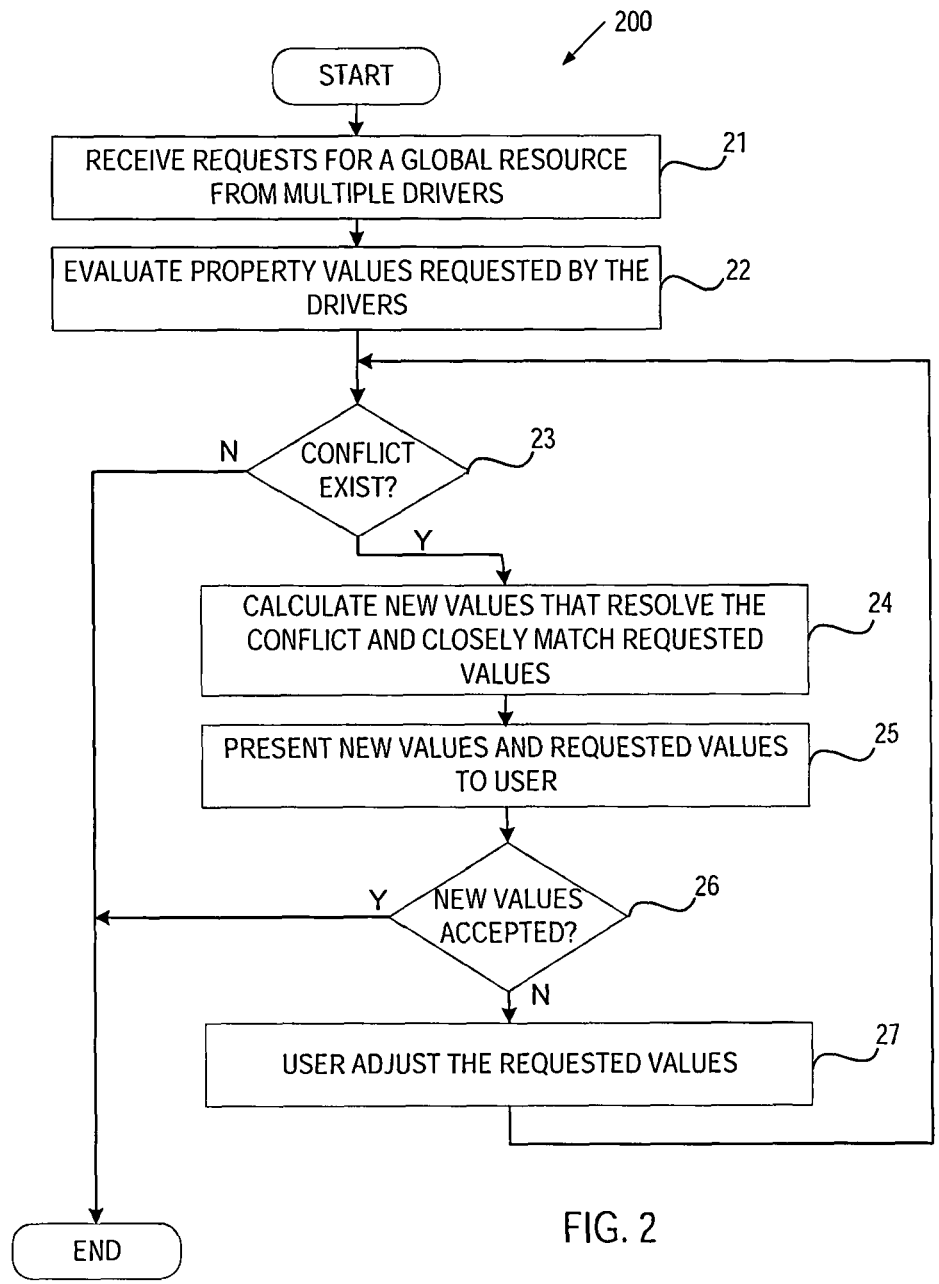
FIG. 2 is a flow diagram of one embodiment of a method that facilitates the global resource conflict management.

A conflict may be resolved by an interactive process 200 as illustrated in the embodiment of FIG. 2. Interactive process 200 may be performed by processing logic of design module 100. Processing logic may comprise hardware (e.g., circuitry, dedicated logic, programmable logic, microcode, etc.), software (such as run on a general purpose computer system or a dedicated machine), or a combination of both.

At block 21, design module 100 receives a user design that includes a plurality of drivers, each requesting a different property value for a common global resource. For example, the drivers may be pulse width modulation (PWM) drivers that request different clock frequencies. At block 22, conflict manager 16 evaluates property values requested by the drivers to determine whether there is a conflict. If there is no conflict (block 23), process 200 ends. If a conflict exists (block 23), conflict manager 16 calculates, at block 24, new property values that resolve the conflict and closely match the driver requests. The new property values may optimize an error metric, e.g., a total average error, a mean square error, or other suitable metrics. At block 25, a conflict management graphical user interface (GUI) is presented to the user. The conflict management GUI presents the new values as well as the requested values. The new values are proposed to the user as an alternative to the requested values. If the user accepts the new values (block 26), process 200 ends and the conflict is resolved. If the user does not accept the new values, at block 27, the user may adjust the requested values and repeat process 200 at blocks 23-27. Process 200 ends when the user accepts the new values proposed by conflict manager 16 or when the user adjustment to the requested values resolves the conflict.

Figure 3:
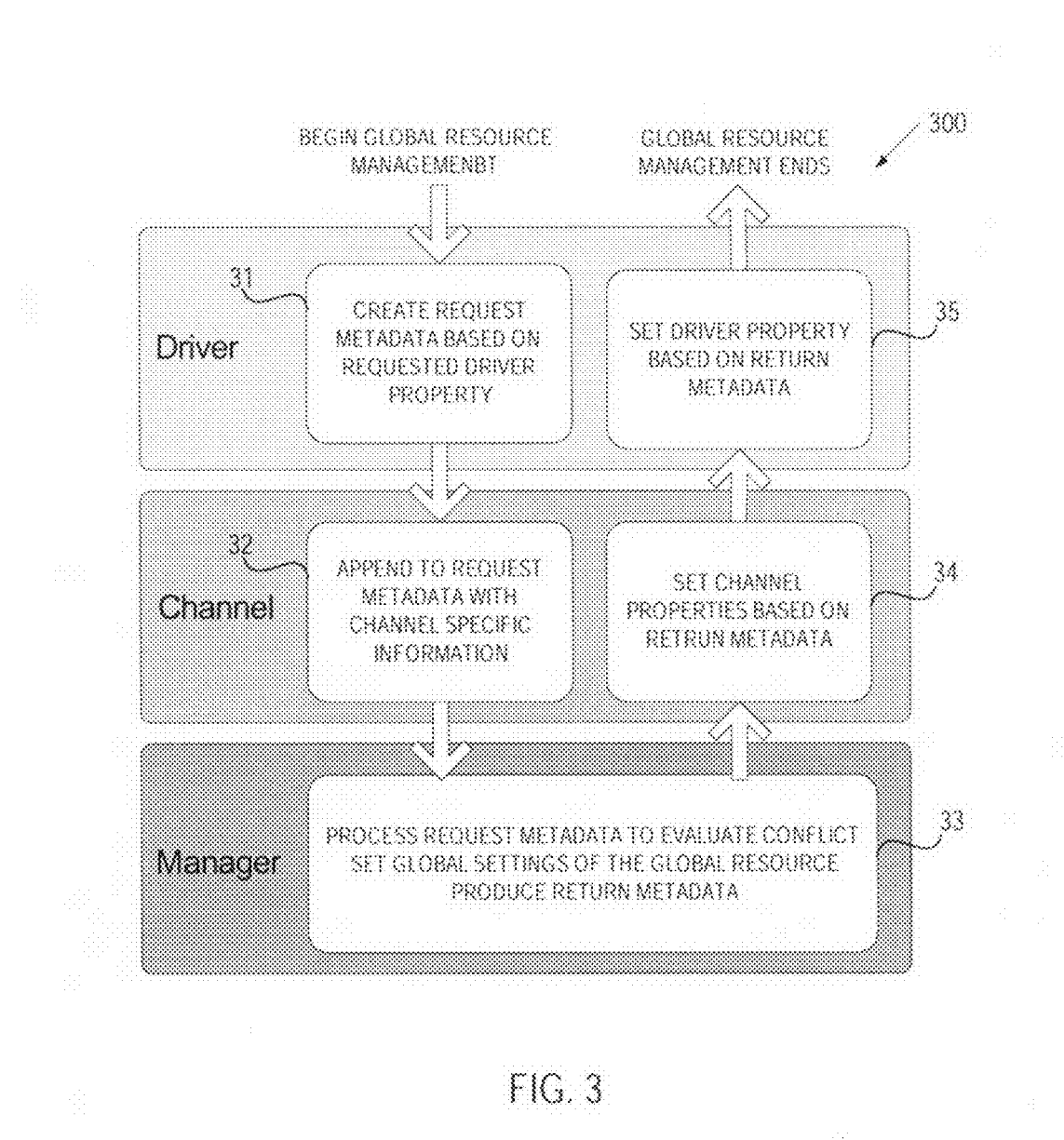
FIG. 3 illustrates an embodiment of a layered operation sequence of the global resource conflict management.

FIG. 3 illustrates a layered operation sequence 300 for invoking conflict manager 16 according to one embodiment of the invention. Operation sequence 300 may be performed by processing logic of design module 100. Processing logic may comprise hardware (e.g., circuitry, dedicated logic, programmable logic, microcode, etc.), software (such as run on a general purpose computer system or a dedicated machine), or a combination of both.

Operation sequence 300 begins with design tool engine 18 receiving requests for a global resource from multiple drivers. The requests may attempt to set a driver property to different values. In response to the requests, design tool engine 18 calls driver scripts to create request metadata (operation 31). The request metadata includes information that directs a channel to modify one or more channel properties corresponding to the requested driver property. Design tool engine 18 appends channel scripts, which includes channel specific information, to the request metadata, and passes it on to conflict manager 16 of the requested global resource (operation 32). Conflict manager 16 then processes the requests from all of the channel instances to determine if a conflict exists (operation 33). Conflict manager 16 sets global settings of the global resource to appropriate values and produces status of the resolution based on the result of the determination. The results generated by conflict manager 16 then propagate back through the layers of channels and drivers. Each channel and driver, respectively, set the corresponding channel and driver properties according to the propagated results (operations 34 and 35). Operation sequence 300 ends if there is no conflict. If a conflict exists, the propagated results (also referred to as conflict metadata) may include the requested values and the new values calculated by conflict manager 16. The conflict metadata may be rendered on the conflict management GUI.

Figure 4:
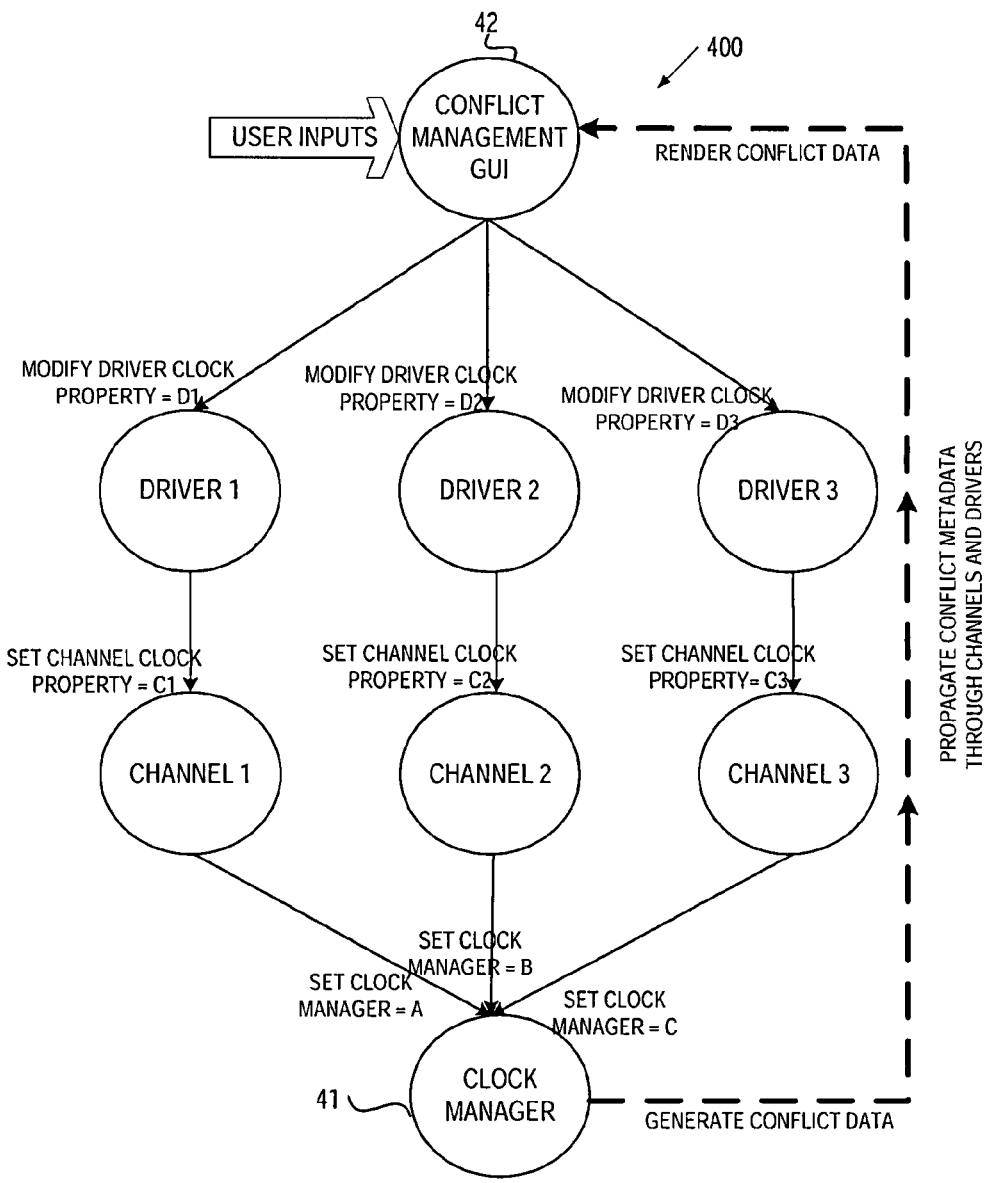
FIG. 4 illustrates an embodiment of operations for resolving conflicts in a global clock resource.

FIG. 4 illustrates an operation flow 400 for resolving conflicts on a clock according to one embodiment of the invention. Operation flow 400 may be performed by processing logic of design module 100. Processing logic may comprise hardware (e.g., circuitry, dedicated logic, programmable logic, microcode, etc.), software (such as run on a general purpose computer system or a dedicated machine), or a combination of both.

In this embodiment, a global clock resource is managed by a clock manager 41. Other global resources may also be used in place of the clock. Operation flow 400 illustrates that a conflict management GUI 42, as directed by a user, submits requests to set or modify the driver clock property to different values. The driver clock property may represent a clock property at a system level meaningful to the user. For example, the driver clock property may represent the clock frequency. Each driver includes a driver script that converts the request to the corresponding channel clock property and passes it on to its associated channel. The corresponding channel clock property may be a lower-level description of the clock than the driver clock property. Each channel includes a channel script that converts the channel clock property to a hardware property of the clock and requests clock manager 41 to set the hardware property of the clock to a different value. For example, the hardware property of the clock may be a clock divider that divides the clock to the requested clock frequency. Clock manager 41 evaluates the different requests and configures the clock according to the requests if no conflict is identified. If a conflict is identified, clock manager 41 calculates alternative values that resolve the conflict, generates conflict metadata including the alternative values, and propagates the conflict metadata through channels and drivers to conflict management GUI 42. The alternative values may be proposed to the user as a guide in the resolution of the conflict.

The global resource conflict management described herein manages global resources to identify and resolve conflicts. A user is given immediate feedback in terms of a system-level driver property as opposed to a hardware-level property. Thus, the effect of the conflict can be shown in a meaningful context to the user. Moreover, sufficient information is forwarded to a conflict management GUI so that a user can make informed decisions about driver property changes.

In one embodiment, the global resource conflict management described herein may be used in a design tool for embedded applications, e.g., PSoC Express™, available from Cypress Semiconductor, Inc., with headquarters in San Jose, Calif. Alternatively, the global resource conflict management may be used in other design tools.

Figure 5:
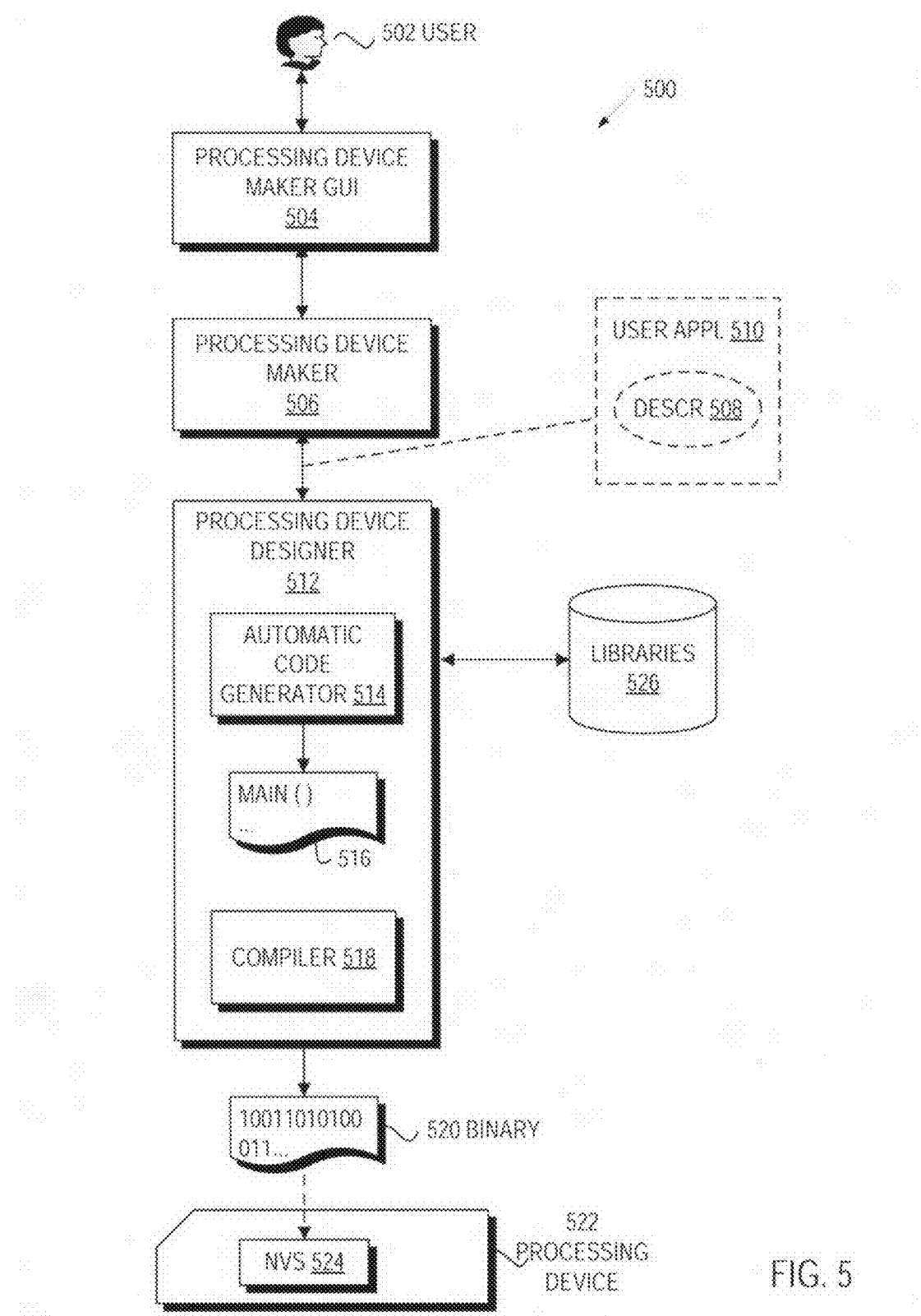
FIG. 5 is a block diagram of one embodiment of a system enabling automated code generation of processing device firmware.

FIG. 5 illustrates an exemplary system 500 in which embodiments of the present invention may operate. System 500 provides automated code generation of processing device firmware in accordance with one embodiment of the present invention.

System 500 includes a processing device maker GUI 504 that may be used by a user 502 to construct a user application 510 for implementation on a processing device 522. The processing device maker GUI 504 overlays a processing device maker 506. The conflict management GUI 42 discussed above in conjunction with FIG. 4 may represent a pop-up window in processing devices maker GUI 504. In addition, the design module 100 of FIG. 1 may be used as part of system 500 to generate the processing device maker GUI 504 and facilitate its functionality during the design of the user application 510.

User application 510 may be described in a user application description 508. In one embodiment, user application description 508 is a text file that describes user's application 510.

After user 502 completes the design of application 510, user 502 may perform a simulation of user application 510. The simulation capability enables hardware independence by verifying the transfer function behavior without requiring the user to compile and debug the firmware on the targeted processing device. Simulation also includes the ability to create complex input files to exhaustively test the transfer function behavior with arbitrarily large combinations of input values. The simulation logs the outputs based on the transfer function behavior so that the results may be analyzed by the user.

Next, user 502 may request via processing device maker GUI 504 that processing device code be automatically generated. User 502 does not have to perform any actual coding. In one embodiment, after user 502 selects the targeted processing device, user application description 508 is handed-off to a processing device designer 512 for the generation of processing device code. Processing device designer 512 may include an automatic code generator 514 that assembles the code for user's application 510 based on the user application description 508. Automatic code generator 514 generates processing device code 516 (e.g., high-level language code, such as C, low-level code, such as Assembly, or a combination thereof).

In one embodiment, automatic code generator 514 references libraries 526 that include code blocks that may be combined to form code 516. Automatic code generator 516 may use at least a portion of user application description 508 as a guide in gathering together various code blocks. Some of the code blocks may be selected based at least in part on targeted processing device 522.

A compiler 518 compiles code 516 to generate a binary 520, also known as a binary image or a Read-Only Memory (ROM) image. Binary 520 is loaded into a Non-Volatile Storage (NVS) 524 of the processing device 522. In one embodiment, NVS 524 includes Flash memory.

Embodiments of processing device 522 may include one or more general-purpose processing devices, such as a microprocessor or central processing unit, a network processor, a microcontroller, an embedded Programmable Logic Device (PLD), or the like. Alternatively, the processing device may include one or more special-purpose processing devices, such as a Digital Signal Processor (DSP), an Application Specific Integrated Circuit (ASIC), a Field Programmable Gate Array (FPGA), or the like. The processing device may also include any combination of a general-purpose processing device and a special-purpose processing device.

It will be appreciated that because code 516 is constructed from pre-built and pre-tested code libraries, time wasted on debugging, such as finding syntax errors, is eliminated. It will also be appreciated that user 502 has generated user application 510 without referencing a targeted processing device. Instead of choosing a processing device to implement a user application and then writing code for that processing device, embodiments of the present invention allow a user application to be created and then code automatically generated for a particular processing device. Moreover, a user may take a user application, make revisions to the user application, and quickly generate revised programming device code.

Figure 6:
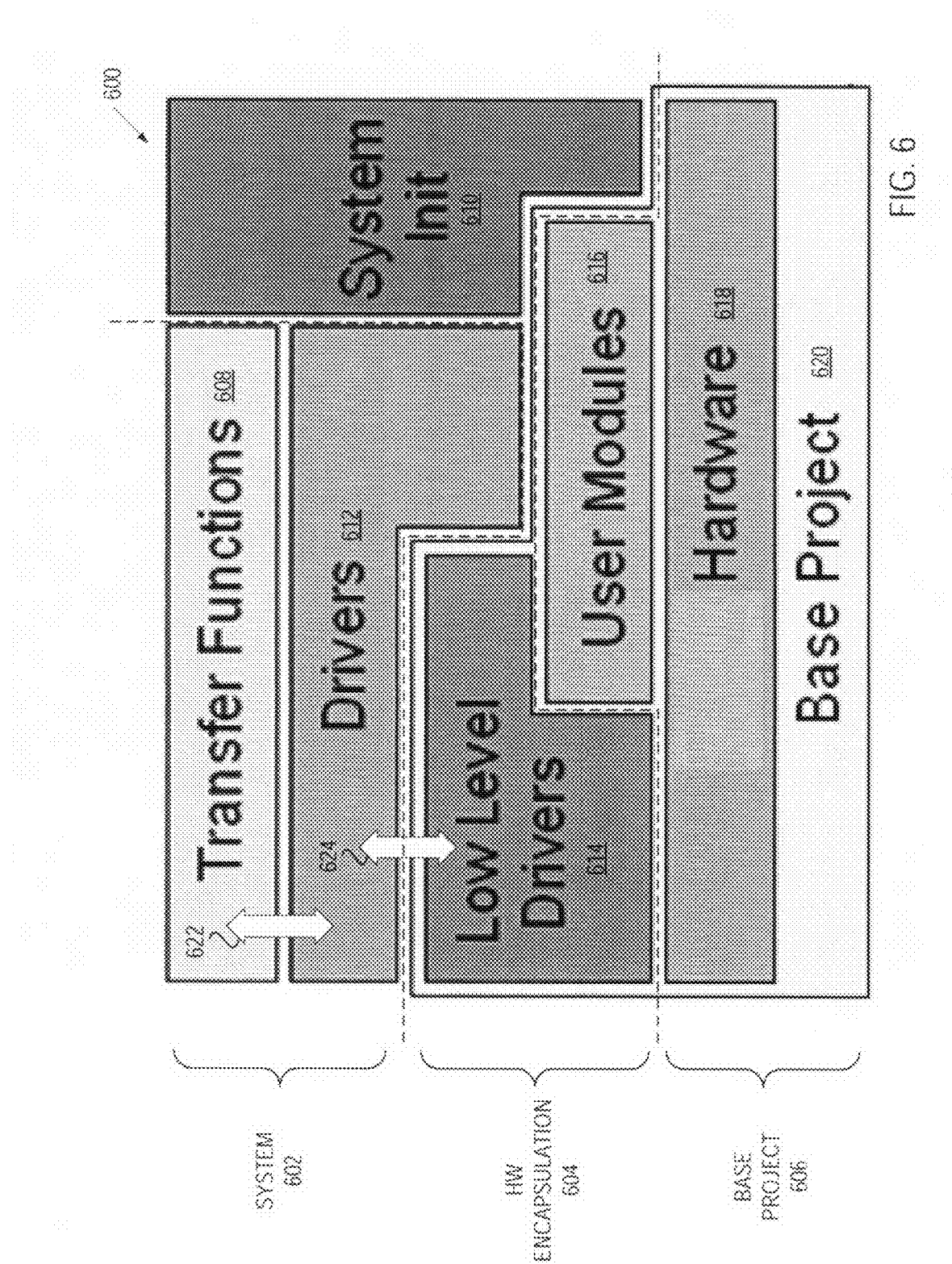
FIG. 6 illustrates a firmware stack in accordance with one embodiment of the present invention.

Referring to FIG. 6, a firmware stack 600 in accordance with one embodiment of the invention is shown. Firmware stack 600 shows a logical structure of at least a portion of the processing device code 516. Data module 15 of FIG. 1 may include at least of portion of firmware stack 600. As discussed below, a portion of the stack is abstracted away from specific hardware. Such hardware independency provides the automatic code generator a consistent architecture for stitching together various code blocks.

Firmware stack 600 includes a system layer 602, a hardware encapsulation layer 604, and a base project layer 606. As will be described further below, the functionality of the system layer 602 is independent of the targeted processing device. Also, interfaces, such as Application Program Interfaces (APIs), made between system layer 602 and the remaining layers of firmware stack 600 are standardized regardless of the targeted processing device. The term "standardized" refers to the hardware independence of the APIs. This abstraction away from specific hardware allows system layer 602 to function without regard to the particular hardware. The low layers of firmware stack 600 have "knowledge" of the specific hardware and take care of the implementation details for system layer 602.

Hardware encapsulation layer 604 and base project layer 606 are generated based at least in part on the targeted processing device. Hardware encapsulation layer 604 represents the underlying hardware to system layer 602. Base project layer 606 includes a set of standard functions associated with the targeted processing device hardware. Base project layer 606 may include functionality at the register level of the targeted processing device. Base project metadata 17 discussed above in conjunction with FIG. 1 may be part of base project layer 606.

System layer 602 may include transfer functions 608 and drivers 612. System layer 602 is targeted by an application level mapping function. Transfer functions 608 invoke the transfer functions defined by the user 602.

Drivers 612 are usually associated with a hardware component of the processing device. In one embodiment, drives 612 may include three types: input, output, or interface. An output driver may be used with a device that is controlled by the user application, such as a fan or heater. Input drivers may be used for sensors, such as temperature or voltage sensors. Interface drivers may be used for devices that allow access to system variables and status, such as an Inter-Integrated Circuit (I2C) or a Serial Peripheral Interface (SPI). Driver metadata 13 discussed above in conjunction with FIG. 1 may be part of drivers 612.

Transfer functions 608 and drivers 612 may communicate with each other using APIs 622. Embodiments of an API include DriverName-Instantiate to initialize a device, DriverName_GetValue to return a value from an input device, and DriverName_GetValue to set an output of an output device to a specific value. Such APIs are defined such that the may be invoked regardless of the particular hardware.

Drivers 612 communicate with hardware encapsulation layer 604 using channels 624. Channels 624 are hardware independent. A channel may be further defined by a channel type, such as an input voltage channel, an output voltage channel, or the like. In one embodiment, channels 624 are implemented as APIs. Channel metadata 14 discussed above in conjunction with FIG. 1 may be part of channels 624.

Hardware encapsulation layer 604 may include low level drivers 614 and system initialization 610. Low level drivers 614 provide the implementation of channels 624. In one embodiment, all drivers 612 use one or more channels 624 to communicate with low level drivers 614. In one embodiment, a channel may have associated parameters assigned by a low level driver, and the associated driver must conform to those parameters.

In one embodiment, the base project layer 606 includes User Modules (UMs) 616 and processing device hardware 618. User modules 616 are used with block arrays in processing device hardware 618 to form hardware components, such as an Analog-Digital Converter (ADC).

FIG. 6 also shows low level drivers 614, user modules 616, and Hardware 618 grouped into a Base Project 620.

Figure 7:
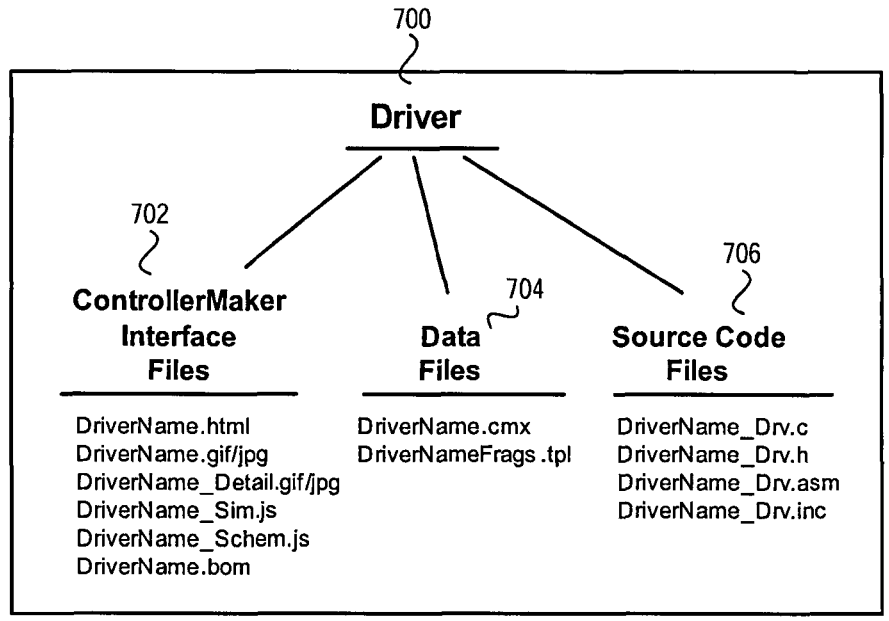
FIG. 7 illustrates a driver in accordance with one embodiment of the present invention.

Turning to FIG. 7, an embodiment of driver 700 is shown. In one embodiment, driver 700 includes several components for device selection and code generation. These components may be grouped into ControllerMaker Interface files 702, Data files 704, and Source Code files 706. Interface files 702 may include files to generate the visual interface in processing device maker GUI 504. Data files 704 are used for driver type selection, resource allocation, user parameter selection, and code generation. Data files 704 may include a driver name file that includes information about channel type, resource requirements, association with image files, and user selectable parameters. In one particular embodiment, the driver name file may be a DriverName.cmx file. The .cmx file extension indicates that the file can be used by a CMX engine, which is a proprietary design tool engine from Cypress Semiconductor, Inc. It is understood that other design tool engines and file formats may also be used. Source code files 706 include the driver firmware. Driver 700 may be written in C, Assembly, or a combination thereof.

Figure 8:
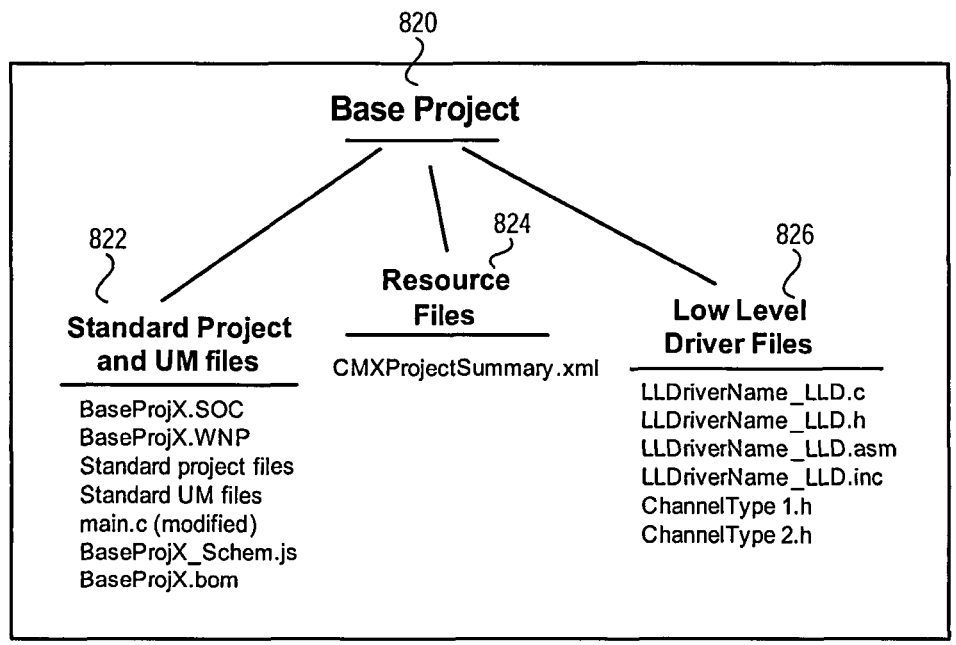
FIG. 8 illustrates a base project in accordance with one embodiment of the present invention.

Turning to FIG. 8, an embodiment of a base project 820 is shown. In one embodiment, base project 820 is built around the targeted processing device. Automatic code generator 514 refers to user application description 508 and adds the appropriate code for the drivers and transfer functions. The standardized calls to and from the drivers provide a consistent architecture for reliably connecting base project 820 to drivers.

Base project 820 may include any system design project using any of the processing device family of parts that support one or more driver channel types. In one embodiment, if a base project supports a given channel type, it must support it fully. The channel may support an external interface to the input or output signal as well as low level firmware to support the signal acquisition and signal conditioning required for reliable signal measurement. Processing device designer 512 adds drivers, such as driver 700, to a base project to support the input/output devices selected by user 502 in user application 510. A project summary file is included in a base project to define what channel types are supported and how many channels are available.

Base project 820 may include standard project and UM files 822, resource files 824, and low level driver files 826. Standard project and UM files 822 may include files that describe the specific user modules employed in the design project and their specific placement. The UM's and their placement determine the mapping of the channels to the external pins. With the UM configuration file, specific UM API files are included in so much as they are needed to control specific interrupt behavior required for successful signal acquisition and conditioning. By themselves these files create an empty project.

Low level driver files 826 provide the implementation of the channels supported by a given base project. A variety of ways can be used to implement a given channel type. For example, a volts channel can be supported by a wide range of ADCs, multiplexers, and ADC resolutions, as long as the API for the specific channel is fully supported. Some base projects may offer more resolution than others for certain channel types. These differences may be specified in a project summary file, e.g, a CMXProjectSummary.xml file. The CMX file prefix indicates that the file can be used by a CMX engine, which is one embodiment of design tool engine 18 of FIG. 1. It is understood that other design tool engines and file formats may also be used.

Resource files may include the project summary file, which may be an eXtensible Markup Language (XML) file contains metadata that communicate a list of resources provided by the base project to design tool engine 18. The XML file indicates the types and count of each of the resource channels and interfaces supported. It also determines the channel assignment order and prioritization, in the case of channels competing for similar resources. It may also provide specifications of each of the channel types, where applicable.

Figure 9:
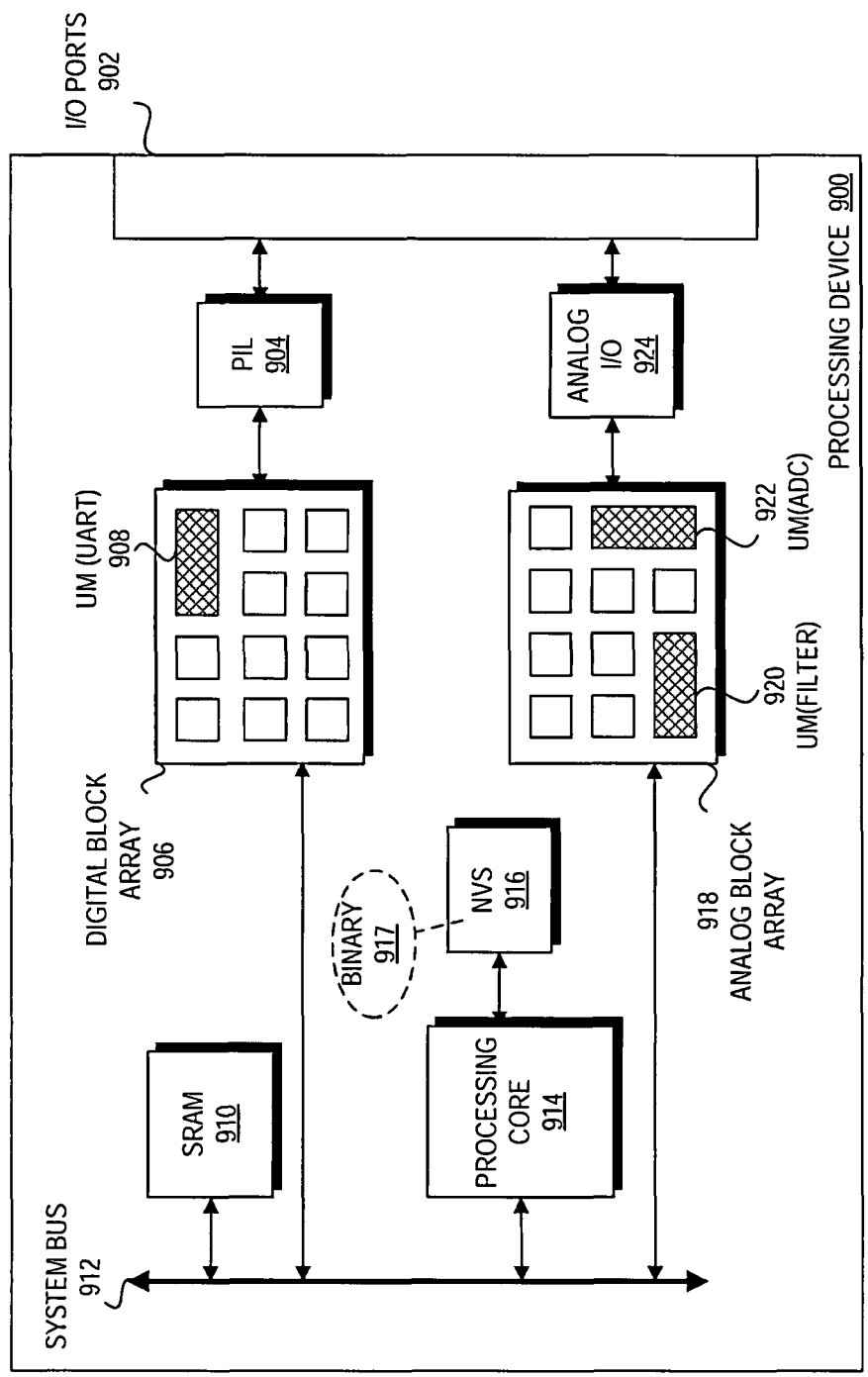
FIG. 9 is a block diagram of one embodiment of a processing device.

Turning to FIG. 9, an embodiment of a processing device 900 is shown. Processing device 900 includes a microcontroller. Processing device 900 includes Input/Output (I/O) ports 902. In one embodiment, I/O ports 902 are programmable. I/O ports 902 are coupled to a Programmable Interconnect and Logic (PIL) 904 which is coupled to a digital block array 906. In FIG. 9, digital block array 906 includes a UM 908 that has been configured as a Universal Asynchronous Receive/Transmitter (UART). Digital block array 906 is coupled to a system bus 912.

A Static Random Access Memory (SRAM) 910 and a processing core 914 are also coupled to system bus 912. Processing core 914 is coupled to NVS 916 which has stored a binary 917. In one embodiment, binary 917 includes instructions generated as described herein. In another embodiment, binary 917 may include instructions executable by processing core 914 as well as instructions for configuring block arrays 916 and 918.

Analog block array 918 is coupled to system bus 912. In the embodiment of FIG. 9, analog block array 918 includes a UM 920 configured as a filter and a UM 922 configured as an ADC. Analog block array 918 is also coupled to an analog I/O unit 924 which is coupled to I/O ports 902. Processing device 900 may also include other components, not shown for clarity, including a clock generator, an interrupt controller, an I2C, or the like.

Figure 10:
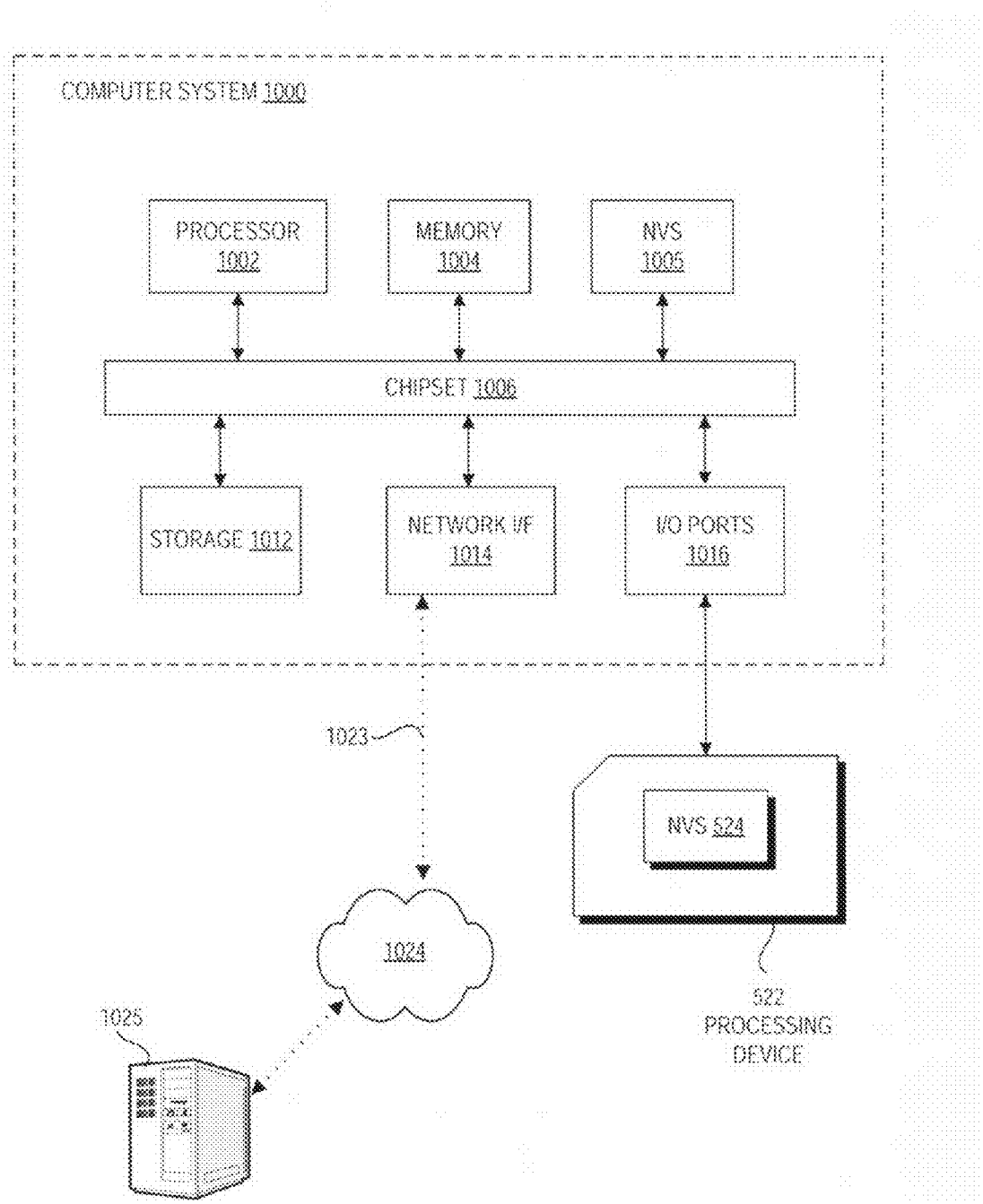
FIG. 10 is a block diagram of one embodiment of a computer system.

FIG. 10 illustrates an exemplary computer system 1000 on which embodiments of the present invention may be implemented. Computer system 1000 includes a processor 1002 and a memory 1004 coupled to a chipset 1006. Storage 1012, Non-Volatile Storage (NVS) 1005, network interface (I/F) 1014, and Input/Output (I/O) ports 1018 may also be coupled to chipset 1006. Embodiments of computer system 1000 include, but are not limited to, a desktop computer, a notebook computer, a server, a personal digital assistant, a network workstation, or the like. In one embodiment, processor 1002 executes instructions stored in memory 1004.

Memory 1004 may include, but is not limited to, Dynamic Random Access Memory (DRAM), Static Random Access Memory (SRAM), Synchronized Dynamic Random Access Memory (SDRAM), or the like.

Chipset 1006 may include a memory controller and an input/output controller. Chipset 1006 may also include system clock support, power management support, audio support, graphics support, or the like. In one embodiment, chipset 1006 is coupled to a board that includes sockets for processor 1002 and memory 1004.

Components of computer system 1000 may be connected by various interconnects. Such interconnects may include a Peripheral Component Interconnect (PCI), a System Management bus (SMBUS), a Low Pin Count (LPC) bus, a Serial Peripheral Interface (SPI) bus, an Accelerated Graphics Port (AGP) interface, or the like.

I/O ports 1016 may include ports for a keyboard, a mouse, a display, a printer, a scanner, or the like. Embodiments of I/O ports 1016 include a Universal Serial Bus port, a Firewire port, a Video Graphics Array (VGA) port, a Personal System/2 (PS/2) port, or the like.

Processing device 522 may be coupled to computer system 1000 via I/O ports 1016. Computer system 1000 may have stored computer-readable instructions, in accordance with embodiments described herein, to allow a user to design application 510 using UIs described herein and automatically generate processing device code for processing device 522 using computer system 1000. This code may be compiled into a binary and loaded into NVS 524.

Computer system 1000 may interface to external systems through network interface 1014. Network interface 1014 may include, but is not limited to, a modem, a Network Interface Card (NIC), or other interfaces for coupling a computer system to other computer systems. A carrier wave signal 1023 may be received and transmitted by network interface 1014. In the embodiment illustrated in FIG. 10, carrier wave signal 1023 is used to interface computer system 1000 with a network 1024, such as a Local Area Network (LAN), a Wide Area Network (WAN), the Internet, or any combination thereof. In one embodiment, network 1024 is further coupled to a computer system 1025 such that computer system 1000 and computer system 1025 may communicate over network 1024.

Computer system 1000 also includes non-volatile storage 1005 on which firmware and/or data may be stored. Non-volatile storage devices include, but are not limited to, Read-Only Memory (ROM), Flash memory, Erasable Programmable Read Only Memory (EPROM), Electronically Erasable Programmable Read Only Memory (EEPROM), Non-Volatile Random Access Memory (NVRAM), or the like. Storage 1012 includes, but is not limited to, a magnetic disk drive, a magnetic tape drive, an optical disk drive, or the like. It is appreciated that instructions executable by processor 1002 may reside in storage 1012, memory 1004, non-volatile storage 1005, or may be transmitted or received via network interface 1014.

For the purposes of the specification, a machine-readable medium includes any mechanism that provides (i.e., stores and/or transmits) information in a form readable or accessible by a machine (e.g., a computer, network device, personal digital assistant, manufacturing tool, any device with a set of one or more processors, etc.). For example, a machine-readable medium includes, but is not limited to, recordable/non-recordable media (e.g., Read-Only Memory (ROM), Random Access Memory (RAM), magnetic disk storage media, optical storage media, a flash memory device, etc.). In addition, a machine-readable medium may include propagated signals such as electrical, optical, acoustical or other forms of propagated signals (e.g., carrier waves, infrared signals, digital signals, etc.).

Various operations of embodiments of the present invention are described herein. These operations may be implemented by a machine using a processor, an Application Specific Integrated Circuit (ASIC), a Field Programmable Gate Array (FPGA), or the like. In one embodiment, one or more of the operations described may constitute instructions stored on a machine-readable medium, that when executed by a machine will cause the machine to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment of the invention.

The above description of illustrated embodiments of the invention, including what is described in the Abstract, is not intended to be exhaustive or to limit the embodiments to the precise forms disclosed. While specific embodiments of, and examples for, the invention are described herein for illustrative purposes, various equivalent modifications are possible, as those skilled in the relevant art will recognize. These modifications can be made to embodiments of the invention in light of the above detailed description. The terms used in the following claims should not be construed to limit the invention to the specific embodiments disclosed in the specification. Rather, the following claims are to be construed in accordance with established doctrines of claim interpretation.

What is claimed is:
1. A computer implemented method, comprising:
identifying a conflict in requested values of a global resource during development of an embedded application in response to determining that at least two drivers are requesting different values from the global resource, wherein a first one of the values is incompatible with a second one of the values, and wherein each of the values represents an operating characteristic of the global resource;

after determining whether a plurality of new values of the global resource resolves the conflict, proposing the new values of the global resource that resolve the conflict as an alternative to the requested values to assist a user in resolution of the conflict; and in response to a user selection of one of the proposed new values, propagating the selected one of the proposed new values to the at least two drivers.

2. The method of claim 1, further comprising:
optimizing a difference between the requested values and the new values.

3. The method of claim 1, further comprising:
receiving an adjustment to at least one of the requested values; and
determining whether the conflict is resolved by the adjustment.

4. The method of claim 3, further comprising:
in response to the adjustment, calculating updated values of the global resource to resolve the conflict.

5. The method of claim 1, further comprising:
propagating the new values through layers of metadata to a user interface, the layers of metadata describing at least a portion of the embedded application.

6. The method of claim 1, further comprising:
converting the requested values from a hardware-level property of the global resource to a system-level property meaningful to the user.

7. The method of claim 1 further comprising:
generating conflict metadata to include the requested values and the new values, the conflict metadata, when rendered on a display, presents an option for a user to adjust the requested values.

8. A computer implemented design tool, comprising:
a processor;
a memory coupled to the processor;
a design engine implemented using the processor to form a design of an embedded application, the design engine configured to allow a global resource to be used by multiple design elements, each requesting a different value of the global resource; and
a conflict manager coupled to the design engine, the conflict manager configured to identify a conflict in requested values of the global resource, determine whether an alternative set of values for the global resource resolves the conflict, and then propose the alternative set of values, wherein each of the values represents an operating characteristic of the global resource, and wherein, in response to a user selecting a value from the proposed values, the conflict manager initiates propagation of said selected value to the multiple design elements.

9. The design tool of claim 8, wherein the conflict manager comprises:
an update unit to propose calculated values of the global resource, as the alternative set of values, to resolve the conflict.

10. The design tool of claim 9, wherein the update unit is configured to calculate the calculated values to optimize a difference between the calculated values and the requested values.

11. The design tool of claim 8, wherein the conflict manager is implemented by a manager script residing in a data module coupled to the design engine.

12. The design tool of claim 11, wherein the data module includes layers of metadata describing at least a portion of the embedded application, the layers of metadata including a hardware layer, a system layer, and a hardware encapsulation layer between the hardware layer and the system layer.

13. The design tool of claim 11, wherein the data module includes a script to convert the requested values from a hardware-level property of the global resource to a system-level property meaningful to the user.

14. The design tool of claim 8, further comprising:
a user interface coupled to the conflict manager to present an option for a user to adjust the requested values.

15. An article of manufacture comprising:
a non-transitory computer-readable medium including a plurality of instructions which when executed perform a method comprising:
identifying a conflict in requested values of a global resource during development of an embedded application in response to determining that at least two drivers are requesting different values from the global resource, wherein each of the values represents an operating characteristic of the global resource;

after determining whether a plurality of new values of the global resource resolves the conflict, proposing the new values of the global resource that resolve the conflict as an alternative to the requested values to assist a user in resolution of the conflict; and in response to a user selecting one of the proposed new values from a plurality of new values, propagating said selected new value to the at least two drivers.

16. The article of manufacture of claim 15, wherein the method further comprises:
optimizing a difference between the requested values and the new values.

17. The article of manufacture of claim 15, wherein the method further comprises:
receiving an adjustment to at least one of the requested values; and
determining whether the conflict is resolved by the adjustment.

18. The article of manufacture of claim 17, wherein the method further comprises:
in response to the adjustment, calculating updated values of the global resource to resolve the conflict.

19. The article of manufacture of claim 15, wherein the method further comprises:
converting the requested values from a hardware-level property of the global resource to a system-level property meaningful to the user.

20. The article of manufacture of claim 15, wherein the method further comprises:
generating conflict metadata to include the requested values and the new values, the conflict metadata, when rendered on a display, presents an option for a user to adjust the requested values.

\* \* \* \* \*